Figure 1:
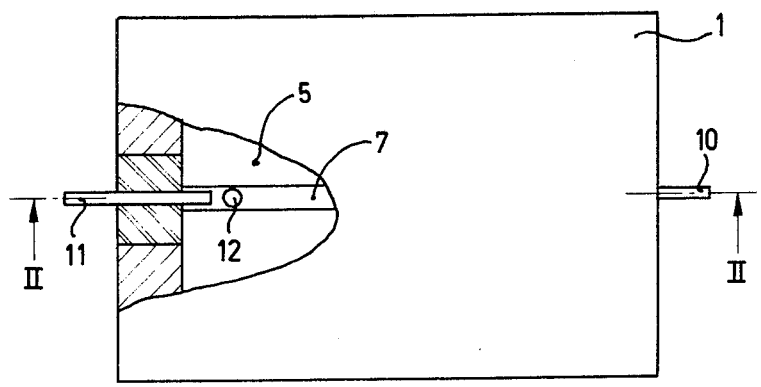

United States Patent [19]

De Ronde

[11] 3,936,778
[45] Feb. 3, 1976

[54] MICROSTRIP DEVICE HAVING MODE SUPPRESSING MEANS

[75] Inventor: Frans Christiaan De Ronde, Eindhoven, Netherlands

[73] Assignee: U.S. Philips Corporation, New York, N.Y.

[22] Filed: Oct. 10, 1974

[21] Appl. No.: 513,705

[30] Foreign Application Priority Data
Oct. 17, 1973  Netherlands ..................... 7314268

[52] U.S. Cl. ............................ 333/84 M; 333/98 M
[51] Int. Cl.² ............................................ H01P 1/16
[58] Field of Search ............ 333/33, 35, 84 M, 98 M

[56] References Cited
UNITED STATES PATENTS
2,983,884   5/1961   Rueger ................................. 333/33
3,768,048   10/1973  Jones, Jr. et al. ................. 333/84 M

*Primary Examiner*—Paul L. Gensler
*Attorney, Agent, or Firm*—Frank R. Trifari; George B. Berka

[57] ABSTRACT

Microwave device comprising a conductive box containing a substrate which is spaced from one wall of the box and on its surface facing the wall is provided with a microstrip line; at least one coaxial terminal leading through another wall of the box is connected to the microstrip line, and at least one mode suppressing member is arranged symmetrically with respect to the axis of the microstrip line.

2 Claims, 4 Drawing Figures

MICROSTRIP DEVICE HAVING MODE SUPPRESSING MEANS

The invention relates to a microwave device which comprises a box made of a conductive material in which is arranged parallel to and spaced from one of the walls a substrate which on its surface facing the wall is provided with a microstrip line pattern and on the opposite surface with a conductive ground plane whilst the box has at least one coaxial terminal connected to a microstrip line of the line pattern, permitting microwave signals to be applied to and derived from the pattern.

Such devices are generally known. At the location of the terminal there is a change from a coaxial transmission line to a planar transmission line or vice versa. As a result the conversion of the mode of the coaxial transmission line into a mode bound to the microstrip line pattern causes a mode coupled to the substrate surface to be excited as well. The latter mode extends through the entire space between the conductive ground plane and the walls of the box and gives rise to undesirable coupling of the terminal to the line pattern or to another terminal in particular if box resonance for this mode occurs.

To prevent this mode it is known to dimension the box or a part thereof by the insertion of conductive partitions so as to form a waveguide having a cut-off frequency such that the unwanted mode cannot propagate, or to place damping material in the box for removing the unwanted mode by attenuation. Such a method either results in restricting the freedom of dimensioning circuits of microstrip design or it causes not only the unwanted mode but also part of the energy of the desired mode to be attenuated.

It is an object of the present invention to obviate the said disadvantages and to provide a very simple method of eliminating the unwanted mode.

A device according to the invention is characterized in that in the space between the substrate and the wall an electrically conductive member is arranged near the terminal symmetrically with respect to the axis of the microstrip line.

Embodiments of the invention will now be described, by way of example, with reference to the accompanying diagrammatic drawings, corresponding part being designated by like reference numerals in the various Figures.

Figure 2:
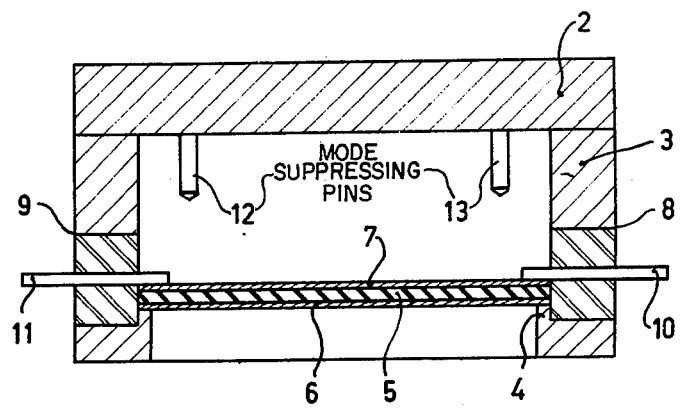
Figure 3:
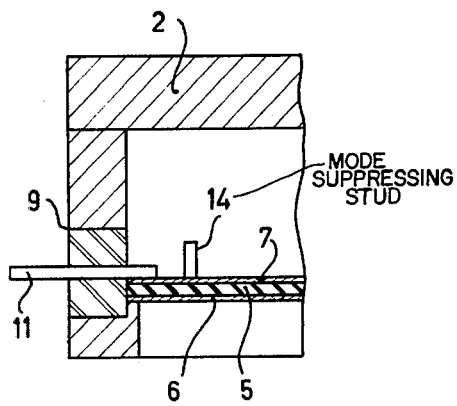
Figure 4:
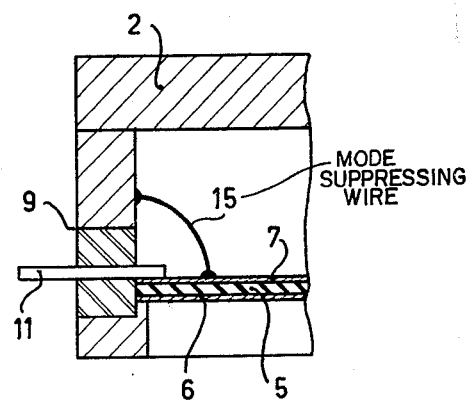

FIG. 1 is a plan view of an embodiment of a microwave device according to the invention, part of the device being cut away, FIG. 2 is a longitudinal sectional view, taken on the line II—II of FIG. 1, of this embodiment of the microwave device according to the invention, FIG. 3 is a cross-sectional view of part of another embodiment of a microwave device according to the invention, and FIG. 4 is a cross-sectional view of part of a further embodiment of a microwave device according to the invention.

Referring now to FIGS. 1 and 2 there is shown a microwave device which comprises a box 1 made of a conductive material which has a cover 2 and an annular frame 3. The frame 3 has a shoulder 4. The box contains a substrate 5 made of a dielectric material which fits in the frame 3.

The substrate may, for example, be made of aluminium oxide having a dielectric constant of 10.8 and may be 0.6 mm thick. The substrate is provided on its lower surface with a ground plane 6 which is made of a conductive material and is conductively connected to the box 1 by way of the shoulder 4, and on its other surface with a line pattern 7 made by etching or by vapour deposition. The box further is formed with two circular holes 8 and 9 in which lines 10 and 11 respectively are coaxially arranged which are held in place by a dielectric material, for example Teflon. The lines 10 and 11 of the resulting coaxial terminals project slightly into the box 1 where they are conductively connected, for example by soldering, to microstrip lines of the line pattern 7.

The parts of the lines 10 and 11 which project from the box 1 form the central conductors of coaxial connecting plugs, not shown.

At the transition from the coaxial transmission line to the planar transmission line a surface wave coupled to the substrate is excited which causes undesirable coupling of the coaxial terminals to one another or to the line pattern.

The invention prevents this coupling in that near each transition of the coaxial transmission line to the planar transmission line an electrically conductive pin 12 and 13 respectively is vertically arranged so as to be symmetrical with respect to the axis of the microstrip line 7. The pins 12 and 13 are conductively secured to the cover, have a length equal to about ¼ of the wavelength associated with the signal frequency and for optimum effect are each spaced from the associated transition by about ½λ.

A possible explanation of the operation is that each pin 12 or 13 slightly disturbs the lines of force of the mode bound to the microstrip line and hence excites a mode coupled to the substrate which is in phase opposition to the unwanted mode excited by the transition between the coaxial and planar transmission lines. By varying the distance of the free ends of the pins 12 and 13 from the microstrip line 7 or by varying the thickness of the pins the amplitude of the excited mode can be adjusted so that the two unwanted surface oscillations cancel out.

FIG. 3 shows another embodiment. A stud 14 of a conductive material is placed on the microstrip line 7. The stud 14 is arranged symmetrically with respect to the axis of the line 7, is directly connected to the line and has a height which is from ⅛ to 1/10 part of the wavelength associated with the signal frequency. For optimum effect the spacing of the stud 14 from the transition of the coaxial transmission line to the planar transmission line is about ½λ. Operation is identical with that of the pins 12, 13 shown in FIGS. 1 and 2.

FIG. 4 shows a further embodiment. FIG. 4 shows a thin conductive wire 15 which at one end is conductively connected to the box 1 and at the other end is conductively connected to the microstrip line 7. The wire 15 is arranged so as to be symmetrical with respect to the axis of the microstrip line 7, for optimum effect follows the electric field line of the unwanted surface wave and has a length of about ¼ of the wavelength associated with the signal frequency. A possible explanation of the operation is that the current produced in the wire 15 by the electric field generates a field pattern of equal magnitude but opposite direction so that the unwanted surface oscillation is suppressed. The wire 15 is thin and because of this and of its symmetrical arrangement relative to the microstrip line 7 and of the particular field line pattern of the mode bound to the microstrip lines does not excite a surface oscillation. Because moreover the wire 15 is ¼λ long it cannot affect the impedance of the microstrip line at the location at which the wire is connected to it.

What is claimed is:

1. A microwave device comprising: a box of conductive material; a substrate arranged parallel to and spaced from one wall of the box, the surface of the substrate facing said one wall being provided with a microstrip line and the opposite surface with a conductive ground plane; at least one coaxial terminal leading through another wall of said box and connected to said microstrip line to supply thereto and derive therefrom microwave operating signals; and at least one electrically conductive stud connected at one end thereof to the microstrip line and forming substantially right angles therewith, said stud having a length of about ¼ of the wavelength of the operating microwave signal and is spaced from the terminal about ½ of said wavelength.

2. A microwave device comprising: a box of conductive material; a substrate arranged parallel to and spaced from one wall of the box, the surface of the substrate facing said one wall being provided with a microstrip line and the opposite surface with a conductive ground plane; at least one coaxial terminal leading through another wall of said box and connected to said microstrip line to supply thereto and derive therefrom microwave operating signals; and at least one thin wire connected at one end to the microstrip line and at the other end to that wall of the box in which the coaxial terminal is disposed, the length of said wire being about ¼ of the wavelength of the operating signal.

* * * * *